United States Patent [19]

Slavin

[11] Patent Number: 4,751,504

[45] Date of Patent: Jun. 14, 1988

[54] CURSOR INTERFACE FOR WAVEFORM DISPLAYS

[75] Inventor: Keith R. Slavin, Aloha, Oreg.

[73] Assignee: Tektronix, Inc., Beaverton, Oreg.

[21] Appl. No.: 30,757

[22] Filed: Mar. 24, 1987

[51] Int. Cl.$^4$ ................... G09G 3/02; G01R 13/30
[52] U.S. Cl. .................................. 340/709; 340/721;
340/722; 340/734; 324/121 R; 324/103 P;
364/487
[58] Field of Search .................. 324/103 P, 121 R;
340/709, 721, 722, 734; 364/487

[56] References Cited

U.S. PATENT DOCUMENTS 4,476,432 10/1984 Olson .............................. 324/121 R
4,628,254 12/1986 Bristol ............................. 324/121 R
4,686,523 8/1987 Bristol .................................. 340/709

Primary Examiner—Howard A. Birmiel
Attorney, Agent, or Firm—Francis I. Gray

[57] ABSTRACT

A cursor interface for a waveform display provides for movement of a waveform relative to a first cursor. When the first cursor overlies a desired point on the waveform, the cursor is locked to the waveform by transforming the cursor coordinates from display coordinates to waveform coordinates. The waveform may then be moved together with the first cursor relative to a second cursor. When the second cursor overlies another desired point on the waveform, a measurement value is displayed indicating the difference in positions on the waveform of the cursors. The cursors may be centered independently, and when locked to the waveform the result is to correspondingly move the waveform.

3 Claims, 3 Drawing Sheets

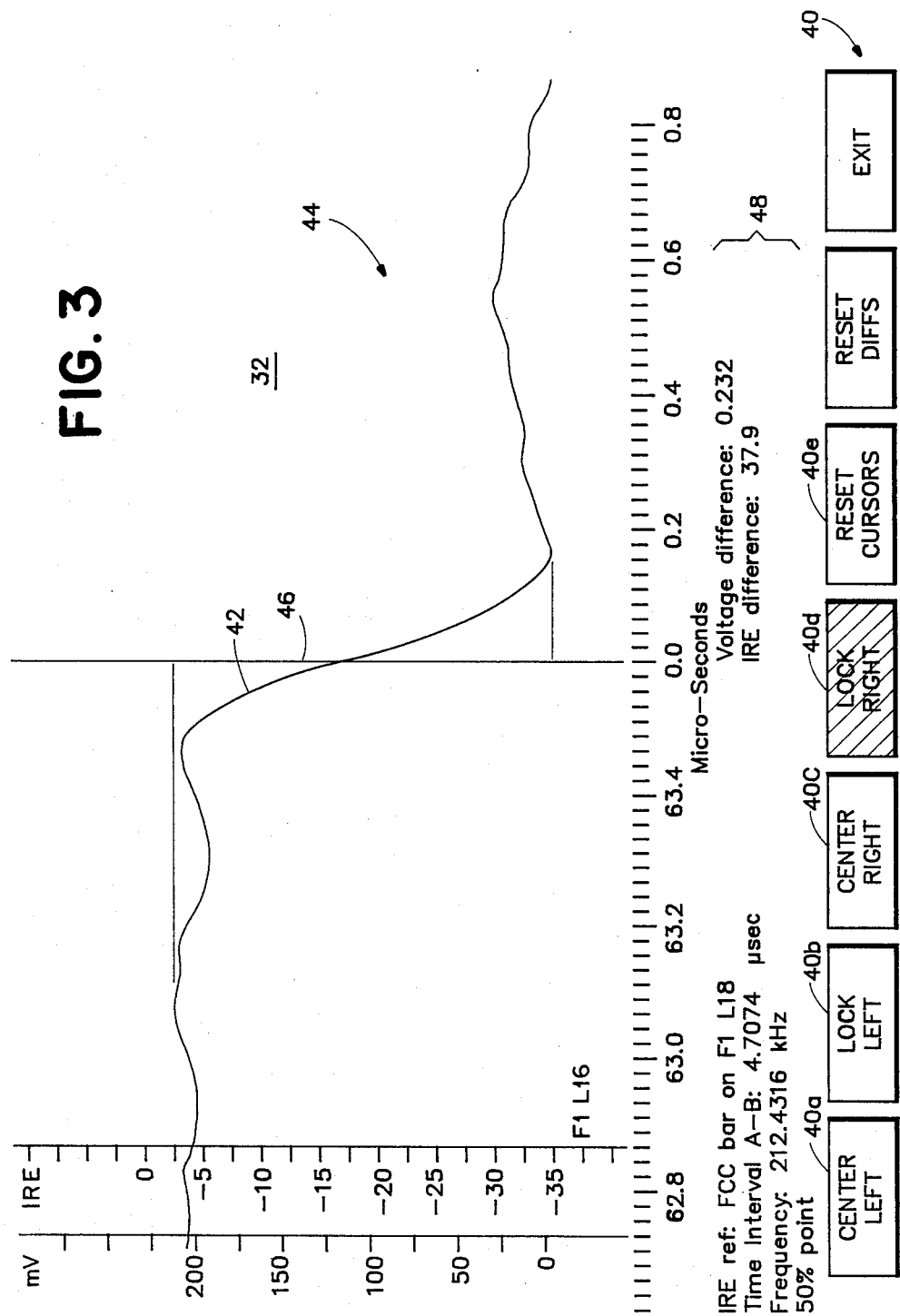

CURSOR INTERFACE FOR WAVEFORM DISPLAYS

BACKGROUND OF THE INVENTION

The present invention relates to waveform display instruments, and more particularly to a cursor interface for waveform displays which allows an operator to adjust the relative positions of a displayed waveform and measurement cursors in a fast, intuitive manner.

In traditional cursor control systems each cursor has its own control knob and the waveform display has a gain and position adjustment. To make measurements between two points on the waveform the gain and position of the waveform have to be adjusted so that both points on the waveform are displayed. Then the cursors are separately adjusted to overlie the respective points and the resulting measurement is read from the graticule scale on the display. For small intervals, such as the width of a horizontal sync pulse in a television video signal, this technique provides fairly accurate results. However for large measurement intervals, like the interval between succeeding horizontal sync pulses, the measurement accuracy is considerably less.

Therefore, what is desired is a cursor interface with the waveform display which provides the ability for accurate measurements between cursors over all intervals.

SUMMARY OF THE INVENTION

Accordingly the present invention provides a cursor interface for waveform displays which provides a means for locking respective cursors to the waveform so that both points between which a measurement is made need not appear on the display simultaneously. The position and gain of a waveform are adjusted relative to a first cursor to allow accurate placement of the first cursor over a first point of the waveform. The cursor is then locked to the waveform so that movement of the waveform results in corresponding movement of the cursor. The position and gain of the waveform are then adjusted relative to a second cursor to allow accurate placement of the second cursor over a second point of the waveform. The measurement value between the two cursors is automatically calculated and displayed as a time differential and corresponding frequency regardless of whether both or either cursor appears on the display.

The objects, advantages and other novel features of the present invention will be apparent from the following detailed description when read in conjunction with the appended claims and attached drawing.

BRIEF DESCRIPTION OF THE DRAWING

FIG. 3 is a plan view of a waveform display for the instrument of FIG. 1 illustrating the cursor interface of the present invention.

DESCRIPTION OF THE PREFERRED EMBODIMENT

Figure 1:
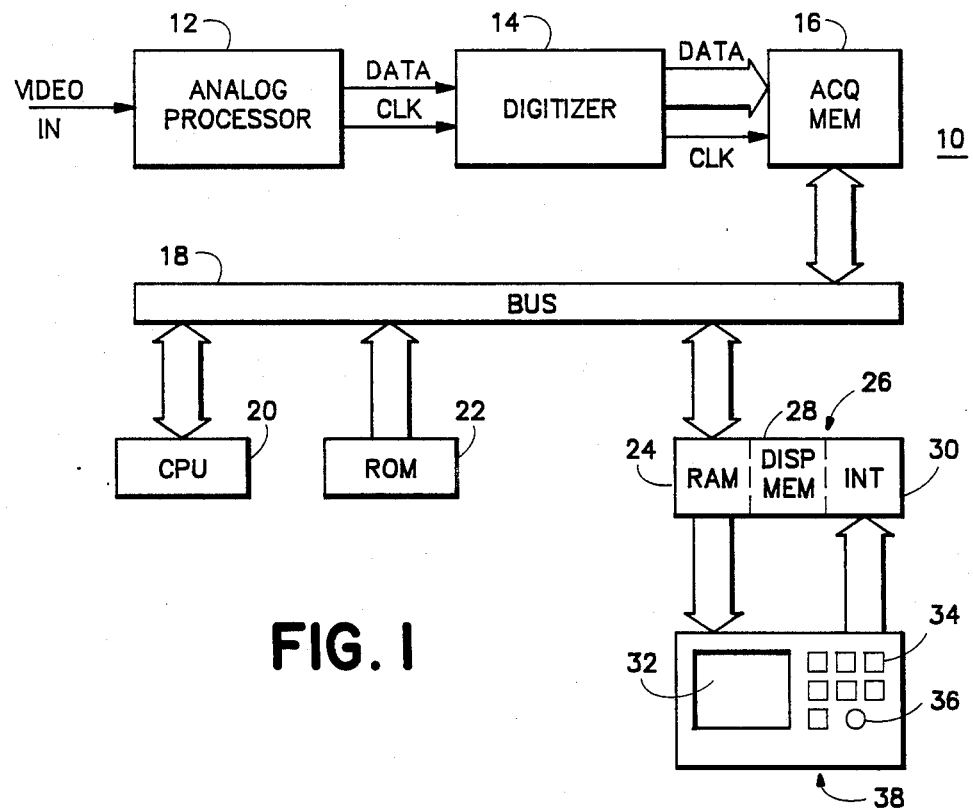
FIG. 1 is a block diagram of an instrument using a cursor interface according to the present invention.
Figure 2:
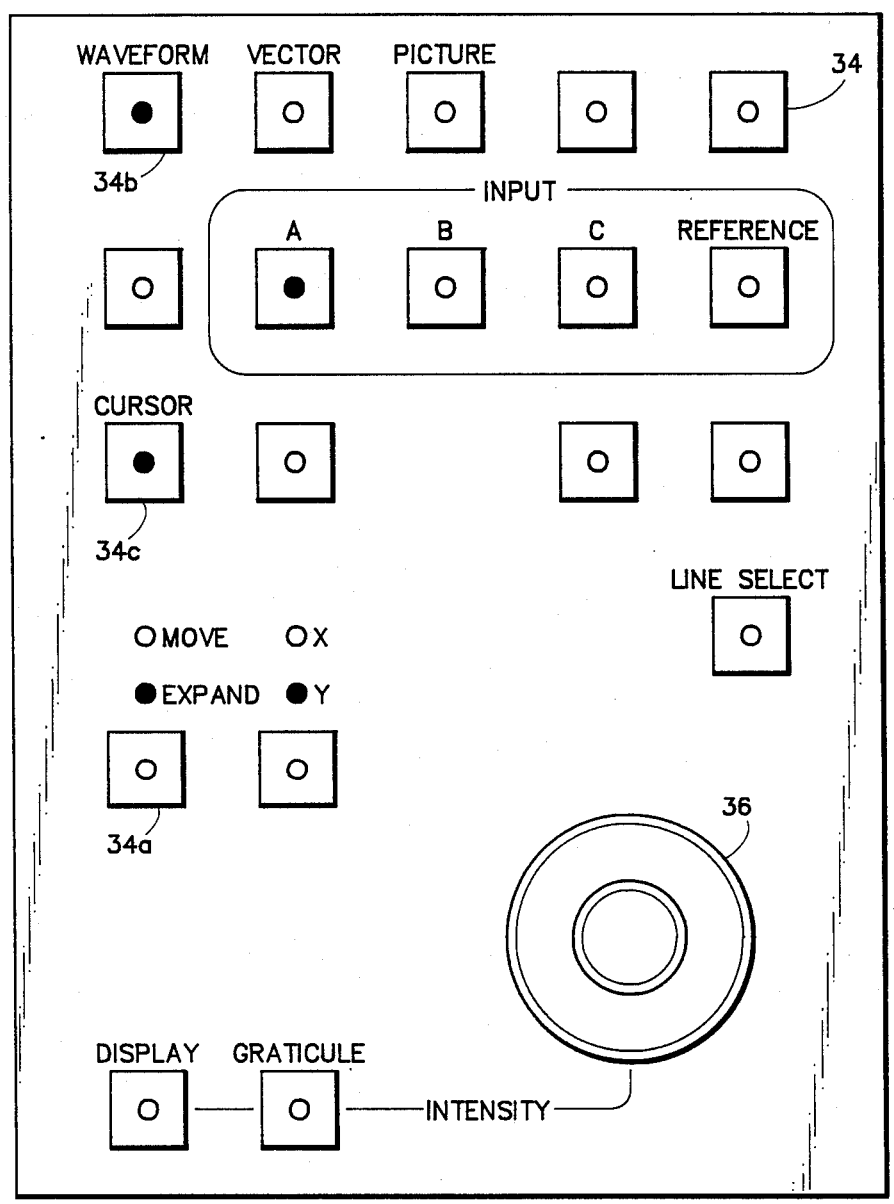
FIG. 2 is a plan view of a front panel for the instrument of FIG. 1.

Referring now to FIGS. 1 and 2 an instrument 10 is shown having a video input signal, such as a television video signal. The video signal is conventionally processed in the analog domain by an analog processor 12, digitized by a digitizer 14, and stored in an acquisition memory 16. The acquisition memory 16 is connected to a communications bus 18 to which also are connected a central processing unit (CPU) 20 with associated ROM 22 and RAM 24, and a display interface unit 26. The display interface unit 26 includes the RAM 24, a display memory 28 and an interface circuit 30. The contents of the display memory 28 are displayed on a screen 32. The digitized video data from the acquisition memory 16 is processed by the CPU 20 according to the functions and parameters input by an operator via function buttons 34 and a rotary encoder 36 on a front panel, and via interaction with the screen 32. The processed data is stored in the display memory 28 together with appropriate scales, cursors and display information. Movement and gain of a waveform on the screen 32 are controlled by an EXPAND/MOVE function button 34a and the rotary encoder 36. The waveform display is selected by the WAVEFORM function button 34b. The cursor interface function is selected by activating a CURSOR function button 34c on the front panel 38.

As shown in FIG. 3 by using a touch screen a plurality of soft keys 40 may be used in lieu of function buttons 34 to display functions on the screen 32 together with a waveform 42. Contact by an operator with the soft keys 40 on the screen 32 results in execution of the indicated function. The soft keys 40 for the cursor interface include a CENTER LEFT key 40a, a LOCK LEFT key 40b, a CENTER RIGHT key 40c, a LOCK RIGHT key 40d and a RESET CURSORS key 40e. Initially, or in response to the RESET CURSORS key 40e, both cursors 46 are unlocked from the waveform 42 and then centered, or preset to a predetermined position, within a display area 44 of the screen 32. The cursors 46 may be centered individually by contacting the respective CENTER LEFT and CENTER RIGHT keys 40a, 40c. Movement or gain changes to the waveform may be made according to the status of the EXPAND/MOVE button 34a by rotating the rotary encoder 36 in the appropriate direction. Activation of the LOCK LEFT or LOCK RIGHT keys 40b, 40d serves to transform the coordinates of the respective cursors via the CPU 20 from those of the display area 44 in terms of pixel positions to those of the waveform 42 in terms of data sample numbers so that the cursor is associated with the underlying point on the waveform. Subsequent movement of the waveform 42 results in corresponding movement of the locked cursor 46, and subsequent centering of the cursor by the respective cursor center keys 40a, 40c while locked to the waveform results in corresponding movement of the waveform. A second activation of the lock keys 40b, 40d serves to unlock the respective cursor 46 from the waveform 42. The difference between the two cursors 46 is determined by the CPU 20 and indicated in an information area 48, which is shown between the display area 44 and the soft keys 40.

In operation if an operator desires to measure the width of a horizontal sync pulse from a television video signal, for example, the operator would expand the waveform 42 via the rotary encoder 36 while the EXPAND/MOVE button 34a is in the expand mode. Then in the move mode the operator would move a point on one edge of the sync pulse under one of the cursors 46 with considerable accuracy. Activation of the appropriate cursor lock key 40b or 40d would lock the selected cursor 46 to the waveform 42. The operator then moves the waveform 42 so that the opposite edge of the sync pulse is under the other cursor 46. The resulting difference in time is displayed in the information area 48 as a Time Interval A-B and as a Frequency. As shown in FIG. 3 the right cursor is locked to the waveform 42 at the trailing edge of horizontal sync and has been moved off the screen 32 due to the expansion of the waveform. The left cursor 46 is located at the leading edge of sync, indicated by the fact that in the information area 48 the 50% point is indicated. The time difference is 4.7074 microseconds corresponding to a frequency of 212.4316 kHz. Although the frequency readout is not particularly significant in this instance, if the time difference was between consecutive horizontal sync leading edges, the frequency would have much greater significance.

Thus the present invention provides a cursor interface on a waveform display which allows accurate cursor placement and waveform measurements without requiring that both cursors be on the screen simultaneously by locking one or both cursors to the waveform and displaying the resulting time difference between the cursors and the corresponding frequency.

What is claimed is:

1. A cursor interface for a waveform display comprising:
   means for positioning a waveform being displayed relative to a first cursor being displayed;
   means for locking the cursor to the waveform at a desired point on the waveform underlying the cursor;
   means for positioning the waveform relative to a second cursor being displayed; and
   means for indicating a measurement value representative of the relative positions of the cursors.

2. A cursor interface as recited in claim 1 wherein the locking means comprises means for transforming the position of the cursor on the waveform display into a position of the cursor on the waveform.

3. A cursor interface as recited in claim 1 further comprising means for centering the cursor within the waveform display, the waveform being moved correspondingly when the cursor is locked to the waveform.

* * * * *